(12) United States Patent  
Nomoto

(10) Patent No.: US 6,320,216 B1  
(45) Date of Patent: *Nov. 20, 2001

(54) MEMORY DEVICE WITH BARRIER PORTIONS HAVING DEFINED CAPACITANCE

(75) Inventor: Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/207,027

(22) Filed: Dec. 8, 1998

(30) Foreign Application Priority Data

Dec. 9, 1997 (JP) .................................................... 9-339051

(51) Int. Cl.⁷ ......................... H01L 31/109; H01L 29/06
(52) U.S. Cl. ..................... 257/315; 257/17; 257/23; 257/21; 257/25; 257/14; 257/9; 29/30; 29/28
(58) Field of Search ............................. 257/315, 17, 23, 257/21, 25, 14, 9, 29, 30, 28

(56) References Cited

U.S. PATENT DOCUMENTS

| | | | |
|---|---|---|---|
| 5,701,017 | * 12/1997 | Patel | 257/27 |
| 5,719,404 | * 2/1998 | Ugajin | 257/21 |
| 5,886,380 | * 3/1999 | Nakajima | 257/321 |
| 6,133,603 | * 10/2000 | Nomoto | 257/315 |

FOREIGN PATENT DOCUMENTS

0569840A1 * 5/1993 (EP) .

* cited by examiner

*Primary Examiner*—Carl Whitehead, Jr.  
*Assistant Examiner*—James Mitchell  
(74) *Attorney, Agent, or Firm*—Sonnenschein, Nath & Rosenthal

(57) ABSTRACT

It is made possible to conduct writing and erasing information at high speed with a low gate voltage, to attain high integration with reduced power dissipation and to retain information accurately. A barrier layer, a transition layer, a barrier layer, a transition layer, a barrier layer, a charge accumulation layer and a barrier layer are stacked one after another on a conduction layer to cause transition of charges in the conduction layer to the charge accumulation layer by resonance tunneling. The conduction layer, the transition layers, and the charge accumulation layer are respectively made of Si. The barrier layers are respectively made of $SiO_2$ so that electron affinity is made large and small alternately between those layers. Each capacitance respectively of the barrier layers is made smaller than $e^2/k_B T$ so that charge transition does not occur according to the Coulomb blockade effect even if a voltage within a predetermined range is applied. Here, e is the electric prime quantity, $k_B$ is the Boltzmann's constant, and T is operation temperature.

15 Claims, 8 Drawing Sheets

MEMORY DEVICE WITH BARRIER PORTIONS HAVING DEFINED CAPACITANCE

This patent claims priority benefits to prior Japan application number P09-339051 dated Dec. 9, 1997.

BACKGROUND OF THE INVENTION

1. Field of the Invention

The present invention relates to a memory device for recording information by accumulating charges, and a memory array formed by integrating the memory devices.

2. Description of the Related Art

A conventional memory device represented by an EEPROM (Electrically Erasable and Programmable Read Only Memory) or a flash memory has a charge accumulation layer for accumulating charges (i.e., electrons or holes) surrounded by an insulating film such as a $SiO_2$ (silicon dioxide) film between a gate electrode and a substrate of a MOS (Metal-Oxide-Semiconductor) transistor. In the memory device, when a high voltage is applied between a source electrode and a drain electrode thereof and a high voltage is applied to the gate electrode, charges are conducted through the insulating film according to tunnel effect and accumulated in the charge accumulation layer and a difference in the number of charges accumulated is retained as a difference in information. The retained information can be read out by using the fact that the magnitude of a current flowing between the source electrode and the drain electrode changes according to the number of charges accumulated in the charge accumulation layer.

In the conventional memory device, however, the charge accumulation layer is surrounded by an insulating film of a single layer. For making the information retaining time sufficiently long, therefore, the insulating film has to be made thick so as to have a thickness in the range of, for example, approximately 10 to 20 nm. For writing and erasing information practically, therefore, a large gate voltage of at least 10 V has to be applied, which results in hindering implementation of finer devices.

Furthermore, in the conventional memory device, whereas a large gate voltage has to be applied for writing or erasing information, even a small gate voltage causes some charge conduction and changes the number of charges accumulated in the charge accumulation layer. In a memory array formed by integrating a plurality of memory devices, therefore, the following problem also occurs: even if writing and reading information are conducted for one memory device, some charge conduction also occurs in memory devices located in the vicinity thereof, and consequently retained information is disturbed.

SUMMARY AND OBJECT OF THE INVENTION

In view of the above described problems, the present invention has been made. An object of the present invention is to provide a memory device which can conduct writing and erasing information at high speed and with a low gate voltage, perform high integration with reduced power dissipation, and retain information accurately, and to provide a memory array formed by integrating the memory devices.

A memory device according to the present invention includes a conduction layer serving as a current passage, a charge accumulation layer for accumulating charges transited from the conduction layer, one or more transition layers for transiting charges from the conduction layer to the charge accumulation layer being formed between the charge accumulation layer and the conduction layer, and a plurality of barrier portions each having a capacitance smaller than $e^2/k_B T$ (where e is the electric prime quantity, $k_B$ is the Boltzmann's constant, and T is operation temperature) being respectively formed between one of the transition layers and the conduction layer, between the transition layers, and one of the transition layers and the charge accumulation layer.

Another memory device according to the present invention includes a conduction layer serving as a current passage, and a coupled quantum box layer formed so as to be adjacent to the conduction layer. Each capacitance of a barrier layer located between the conduction layer and a quantum box layer and barrier layers located in between each quantum box layer are smaller than $e^2/k_B T$ (where e is the electric prime quantity, $k_B$ is Boltzmann's constant, and T is operation temperature).

A memory array according to the present invention is obtained by integrating the memory devices of the present invention.

In the memory device according to the present invention, when a voltage is applied between the conduction layer and the charge accumulation layer in a forward direction, charges in the conduction layer transit to the charge accumulation layer via the transition layers. Thereby, charges are accumulated in the charge accumulation layer, and information is retained. This information can be read out since the value of a current flowing through the conduction layer varies depending on whether charges are accumulated in the charge accumulation layer or not. Also when a voltage is applied between the conduction layer and the charge accumulation layer in a reverse direction, the charges accumulated in the charge accumulation layer transit to the conduction layer via the transition layers. Thereby, the information is erased. Since the transition of charges between the conduction layer and the charge accumulation layer is conducted via the transition layers, writing and erasing information can be conducted at high speed and with low power. Furthermore, since the barrier portion has a capacitance smaller than $e^2/k_B T$, the charge transition between the conduction layer and the charge accumulation layer does not occur even if a voltage in a predetermined range is applied. In other words, if a voltage having a magnitude exceeding the predetermined range is applied, charges transit from the conduction layer to the charge accumulation layer or from the charge accumulation layer to the conduction layer.

In another memory device according to the present invention, when a voltage is applied between the conduction layer and the coupled quantum box layer in a forward direction, charges transit in the conduction layer to the coupled quantum box layer. Thereby, information is retained. This information can be read out since the value of a current flowing through the conduction layer varies depending on whether charges are accumulated in the coupled quantum box layer or not. Also, when a voltage is applied between the conduction layer and the coupled quantum box layer in a reverse direction, the charges accumulated in the charge accumulation layer transit to the conduction layer. Thereby, the information is erased. Since the coupled quantum box layer is used, the charge transition between the conduction layer and the coupled quantum box layer is caused by resonance tunneling and writing and erasing information are conducted at high speed and with low power. Furthermore, since the barrier layer in the coupled quantum box layer has a capacitance smaller than $e^2/k_B T$, the charge transition between the conduction layer and the coupled quantum box layer does not occur even if a voltage in a predetermined range is applied. In other words, if a voltage having a magnitude exceeding the predetermined range is applied, charges transit from the conduction layer to the coupled quantum box layer or from the coupled quantum box layer to the conduction layer.

A memory array according to the present invention uses the memory devices of the present invention. By applying a voltage above or below a predetermined value between the conduction layer and the charge accumulation layer or between the conduction layer and the coupled quantum box layer of a specific memory device, information is written or erased.

DETAILED DESCRIPTION OF THE PREFERRED EMBODIMENTS

Figure 1:
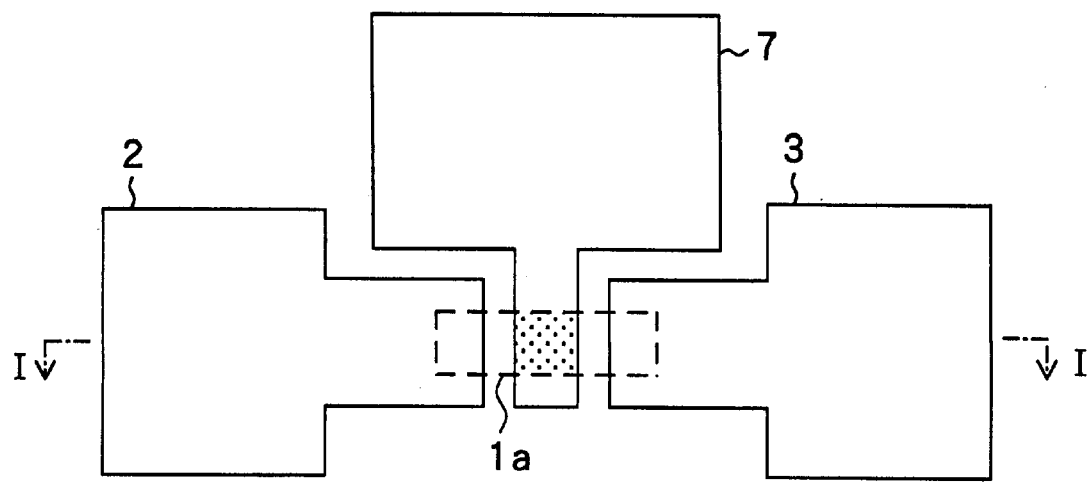
FIG. 1 is a top view showing the configuration of a memory device according to a first embodiment of the present invention.

Hereafter, embodiments of the present invention will be described in detail by referring to the drawings.
(First Embodiment)

Figure 2:
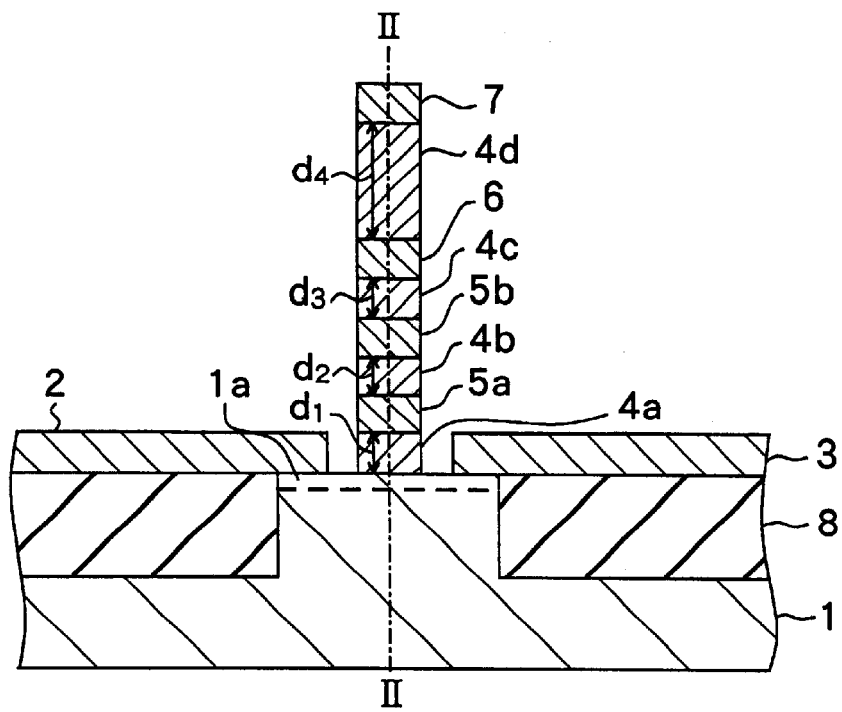
FIG. 2 is a sectional view taken along a line I—I showing the configuration of the memory device shown in FIG. 1.

FIG. 1 is a top view of the structure of a memory device according to a first embodiment of the present invention. FIG. 2 shows the section structure of the memory device of FIG. 1 taken along a line I—I of FIG. 1. In this memory device, a source electrode 2 and a drain electrode 3 each made of suitable metal are formed on a suitable substrate 1 having an interval in between. On the top of the substrate 1 between the source electrode 2 and the drain electrode 3, a charge accumulation layer 6 and a barrier layer 4d are stacked via a plurality of barrier layers serving as barrier portions and one or more transition layers each formed between barrier layers (here, three barrier layers 4a, 4b and 4c, and two transition layers 5a and 5b formed in between). Thereon, a gate electrode (control electrode) 7 made of suitable metal is formed. The gate electrode 7 and the barrier layer 4d are in a non-ohmic junction state.

On the surface of the substrate 1 between the source electrode 2 and the drain electrode 3, two-dimensional electron gas (2DEG) is accumulated and a conduction layer 1a serving as a current passage is formed. The conduction layer 1a is in an ohmic junction state with source electrode 2 and the drain electrode 3 respectively. On the surface of the substrate 1, a device isolation portion 8 for isolating this memory device from other devices is formed so as to surround a predetermined region located between the source electrode 2 and the drain electrode 3.

At least the surface (the surface on which the source electrode 2 and so on are formed) of the substrate 1 is made of a suitable semiconductor. For example, a semiconductor substrate made of a suitable semiconductor may be used as the substrate 1. It is also possible to use a substrate obtained by forming a suitable semiconductor thin film on a surface of a substrate main body made of sapphire or suitable glass or plastic, such as a SOI (Silicon-On-Insulator) substrate or a SOS (Silicon-On-Sapphire) substrate. In other words, the conduction layer 1a is made of a suitable semiconductor. Furthermore, the barrier layers 4a, 4b, 4c and 4d, the transition layers 5a and 5b, and the charge accumulation layer 6 are also made of suitable semiconductors respectively.

However, the barrier layer 4a formed between the conduction layer 1a and the transition layer 5a is made of a semiconductor which has a smaller electron affinity or a larger work function than the semiconductor forming the conduction layer 1a (i.e., the substrate 1) and the semiconductor forming the transition layer 5a. Also, the barrier layer 4b formed between the transition layers 5a and 5b is made of a semiconductor which has a smaller electron affinity or a larger work function than the semiconductor forming the transition layer 5a and the semiconductor forming the transition layer 5b. Furthermore, the barrier layer 4c formed between the transition layer 5b and the charge accumulation layer 6 is made of a semiconductor which has a smaller electron affinity or a larger work function than the semiconductor forming the transition layer 5b and the semiconductor forming the charge accumulation layer 6. In addition, the barrier layer 4d formed between the charge accumulation layer 6 and the gate electrode 7 is made of a semiconductor which has a smaller electron affinity or a larger work function than the semiconductor forming the charge accumulation layer 6.

For example, the conduction layer 1a, the transition layers 5a and 5b, and the charge accumulation layer 6 are made of Si (silicon), and the barrier layers 4a, 4b, 4c and 4d are made of $SiO_2$, $Si_3N_4$ (silicon nitride) or SiON. Alternatively the conduction layer 1a, the transition layers 5a and 5b, and the charge accumulation layer 6 are made of SiGe or Ge (germanium), and the barrier layers 4a, 4b, 4c and 4d are made of SiGe, Si, $SiO_2$, $Si_3N_4$ or SiON respectively. Or the conduction layer 1a, the transition layers 5a and 5b, and the charge accumulation layer 6 are respectively made of a Group III–V compound semiconductor including at least one element selected from the group consisting of In (indium) and Ga (gallium) of Group III element and As (arsenic) of the Group V element, and the barrier layers 4a, 4b, 4c and 4d are made of a Group III–V compound semiconductor including at least one element selected from the group consisting of In, Al (aluminum) and Ga of the Group III element and As of the Group V element. Alternatively, the conduction layer 1a, the transition layers 5a and 5b, and the charge accumulation layer 6 are made of a Group III–V compound semiconductor including at least one element selected from the group consisting of In and Ga of the Group III element and Sb (antimony) of the Group V element, and the barrier layers 4a, 4b, 4c and 4d are respectively made of a Group III–V compound semiconductor including at least one element selected from the group consisting of In, Al and Ga of the Group III element and Sb of the Group V element.

Figure 3:
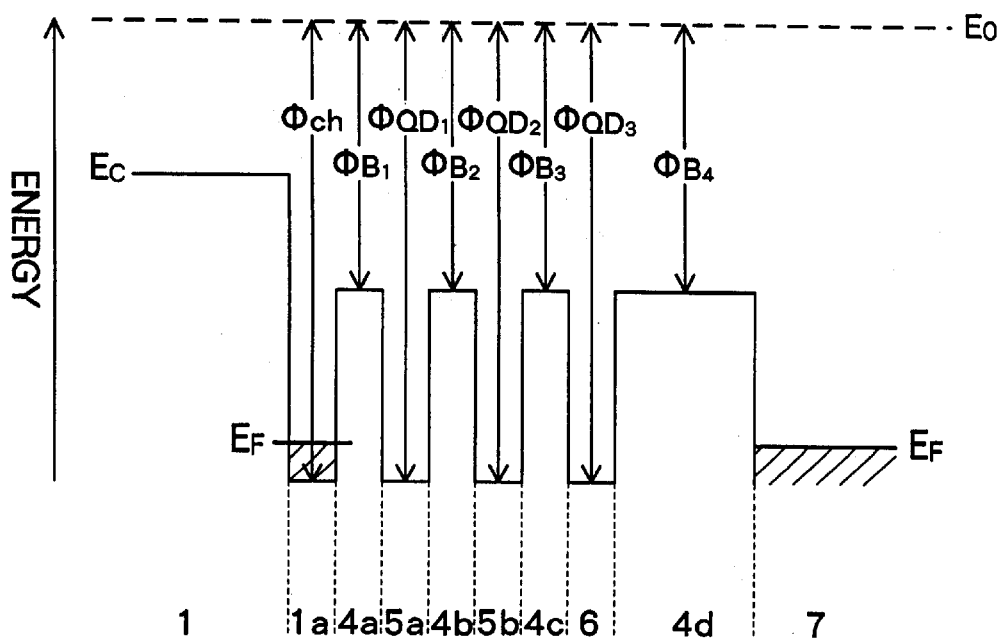
FIG. 3 is an energy band structure diagram taken along a line II—II of FIG. 2 at the time of thermal equilibrium.

When respective layers are made of these semiconductors, the energy band structure of the memory device taken along a line II—II of FIG. 2 becomes as shown in FIG. 3. Here, Ec denotes an energy level at a conduction band end, $E_F$ is a Fermi level, and Eo is a vacuum level. Furthermore, φ ch is an electron affinity of a material forming the conduction layer 1a, and $\phi_{B1}$, $\phi_{B2}$, $\phi_{B3}$ and $\phi_{B4}$ are respectively electron affinities of materials forming the barrier layers 4a, 4b, 4c and 4d. In addition, $\phi_{QD1}$ and $\phi_{QD2}$ are respectively electron affinities of materials forming the transition layers 5a and 5b, and $\phi_{QD3}$ is an electron affinity of a material forming the charge accumulation layer 6.

Each thickness d1, d2 and d3 respectively of the barrier layers 4a, 4b and 4c is set to such a distance that charges can tunnel (for example, 50 nm or less), and thickness d4 of the barrier layer 4d is set to such a distance that charges cannot tunnel easily (for example, at least 50 nm). Furthermore, each capacitance $C_1$, $C_2$ and $C_3$ respectively of the barrier layers 4a, 4b and 4c is made smaller than $e^2/k_BT$, where e is the electric prime quantity (1.6 a×10$^{-19}$ C), $k_B$ is the Boltzmann's constant (1.38×10$^{-23}$ J/K), and T is operation temperature whereat the device is used.

By the way, the capacitance C is typically inversely proportional to the distance d which is proportional to an area S as represented by expression (1) below. In addition, each thickness d1, d2 and d3 respectively of the barrier layers 4a, 4b and 4c cannot be made thicker than a predetermined value in order to make charges tunnel. In other words, areas $S_1$, $S_2$ and $S_3$ respectively of portions of the barrier layers 4a, 4b and 4c in which tunneling of charges occurs are smaller than $e^2d_1/\in_1 k_BT$, $e^2d_2/\in_2 k_BT$ and $e^2d_3/\in_3 k_BT$, respectively, where $\in_1$, $\in_2$ and $\in_3$ are dielectric constants respectively of the barrier layers 4a, 4b and 4c. The areas $S_1$, $S_2$ and $S_3$ where tunneling of charges occurs correspond to an area of contact between the barrier layer 4a and the conduction layer 1a (i.e., an area of a dotted portion in FIG. 1), and are equal to each other.

$$C = \in S/d \quad (1)$$

where $\in$ is the dielectric constant, S is the area, and d is the distance.

For example, it is now assumed that the conduction layer 1a, the transition layers 5a and 5b, and the charge accumulation layer 6 are made of Si, and the barrier layers 4a, 4b, 4c and 4d are made of SiO2 respectively. It is further assumed that the thickness d1, d2 and d3 respectively of the barrier layers 4a, 4b, 4c and 4d are 10 nm. When such device is used at approximately room temperature of 27° C. (300° K), then each of the dielectric constants $\in_1$, $\in_2$ and $\in_3$ respectively of the barrier layers 4a, 4b and 4c become approximately 3.5×10$^{-11}$ [F/m], and the area of the contact between the barrier layer 4a and the conduction layer 1a (i.e., areas $S_1$, $S_2$ and $S_3$) become 1.8×10$^{-15}$ m$^2$. If it is now assumed that the dotted portion in FIG. 1 takes the shape of a square, the length of one side thereof is approximately 42 nm.

Here, each thickness of the transition layers 5a and 5b and the charge accumulation layer 6 also becomes thin, and those layers become quantum box layers. In other words, the barrier layers 4a, 4b, 4c and 4d, the transition layers 5a and 5b, and the charge accumulation layer 6 form a multiple quantum box layer allowing mutual quantum-mechanical tunneling (i.e., coupled quantum box layer). However, the transition layers 5a and 5b and the charge accumulation layer need not to be thin in thickness, but may be thick.

The memory device having such a configuration operates as described below.

Figure 4:
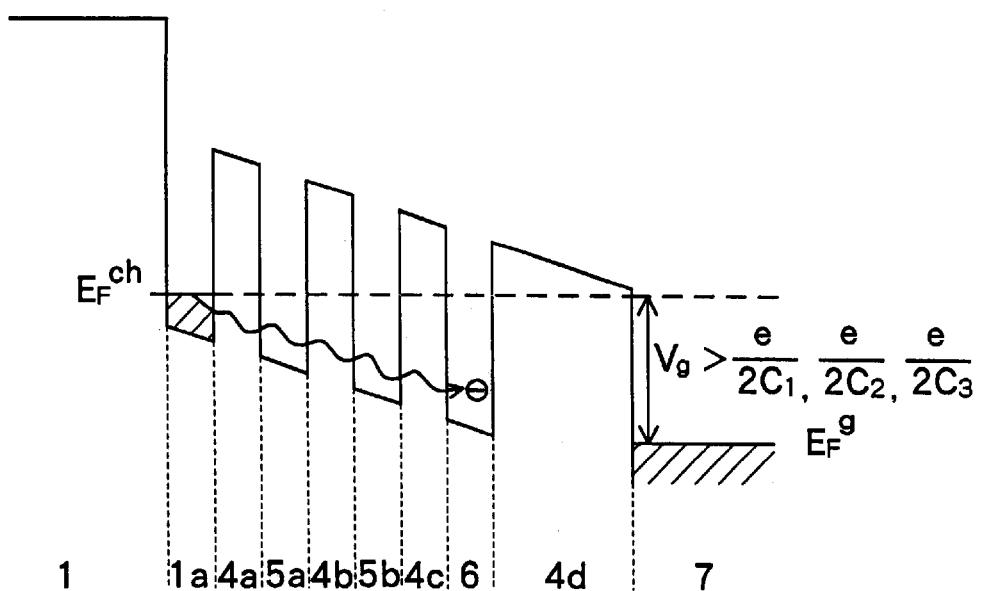
FIG. 4 is an energy band structure diagram for description of writing operation of the memory device of FIGS. 1 and 2.

In this memory device, information is first written by applying a positive gate voltage (control voltage) Vg of forward bias to the gate electrode 4. An energy band structure taken along a line II—II of FIG. 2 at this time is shown in FIG. 4. Here, $E_F^{Ch}$ and $E_F^g$ are Fermi levels of the conduction layer 1a and the gate electrode 4, respectively.

In this memory device, the capacitance $C_1$, $C_2$ and $C_3$ respectively of the barrier layers 4a, 4b and 4c are smaller than $e^2/k_BT$. If the gate voltage Vg is smaller than each of $e/2C_1$, $e/2C_2$ and $e/2C_3$, therefore, electrons of the conduction layer 1a cannot transit to the charge accumulation layer 6 according to the so-called Coulomb blockade effect (see "Single Charge Tunneling" edited by H. Grabert and M. H. Devoret, Plenum Press, New York, 1992).

Figure 5:
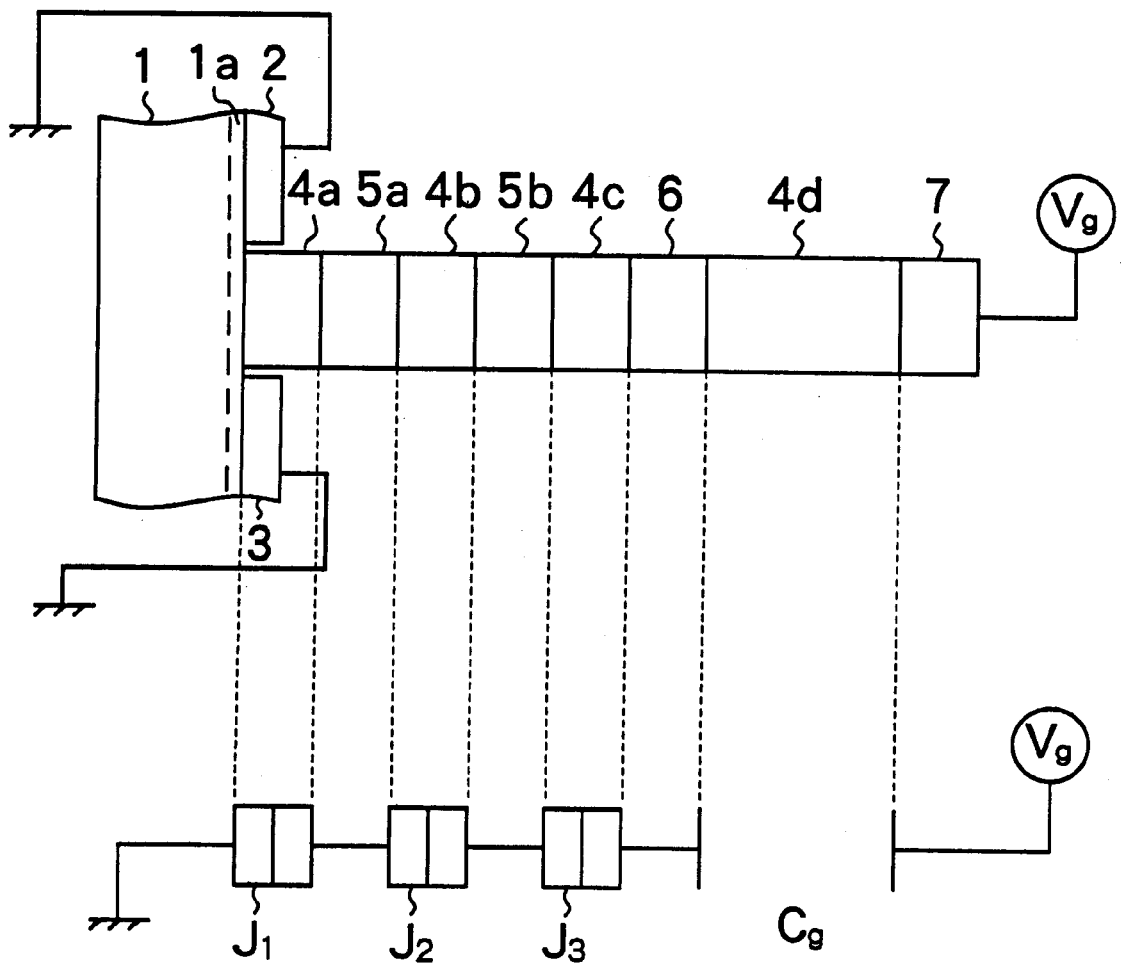
FIG. 5 is a circuit diagram showing an equivalent circuit of the memory device of FIGS. 1 and 2.

If the gate voltage Vg is made larger than each $e/2C_1$, $e/2C_2$ and $e/2C_3$, however, electrons of the conduction layer 1a transit to the charge accumulation layer 6 via the transition layers 5a and 5b as shown in FIG. 4. This transition is caused by resonance tunneling occurred between the conduction layer 1a and the charge accumulation layer 6. Therefore, the transition occurs at extremely high speed. Assuming that this memory is equivalent to a circuit shown in FIG. 5, the writing time at this time becomes $(R_1+R_2+R_3)$ Cg. In the equivalent circuit shown in FIG. 5, $J_1$, $J_2$ and $J_3$ respectively correspond to the barrier layers 4a, 4b and 4c, and are tunnel junctions respectively having tunnel resistance $R_1$, $R_2$ and $R_3$, and capacitance $C_1$, $C_2$ and $C_3$. Furthermore, Cg corresponds to the barrier layer 4d, and is a capacitor having a capacitance Cg.

For example, if the capacitance $C_1$, $C_2$ and $C_3$ respectively of the barrier layers 4a, 4b and 4c are 4×10$^{-19}$ F, and the tunnel resistance $R_1$, $R_2$ and $R_3$ are 1×10$^{10}$Ω, then the gate voltage required for writing becomes approximately 0.2 V. As compared with a conventional flash memory requiring the gate voltage in the range of 10 to 20 V, the present memory device operates with an extremely small voltage. Furthermore, if the capacitance Cg of the barrier layer 4d is 1×10$^{-18}$ F, then the time required for writing becomes 30 ns, and the memory device thus operates at high speed.

Figure 6:
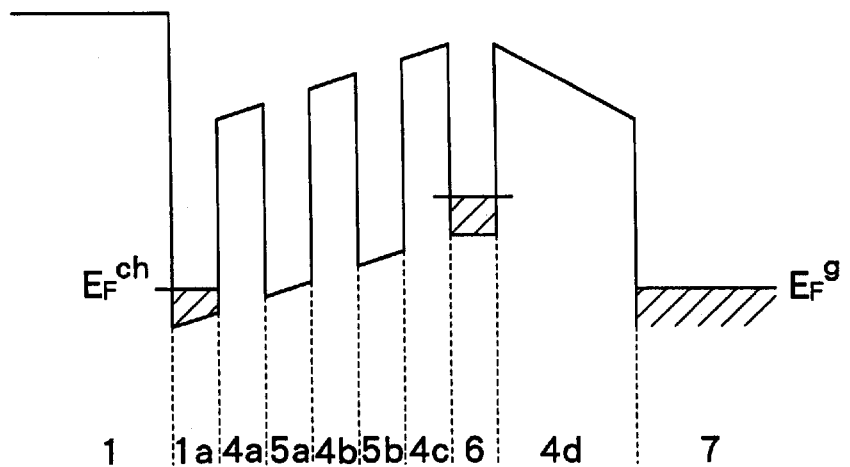
FIG. 6 is an energy band structure diagram for description of writing operation of the memory device of FIGS. 1 and 2.

Subsequently, the gate voltage Vg is returned to zero. An energy band structure taken along a line II—II of FIG. 2 is shown in FIG. 6. In this way, it becomes difficult for electrons accumulated in the charge accumulation layer 6 to transit to the conduction layer 1a according to the Coulomb blockade effect. Here, the resistance occurred when the electrons accumulated in the charge accumulation layer 6 transit to the conduction layer 1a is approximately $R_K$ $(R_1/R_K)(R_2/R_K)(R_3/R_K)$, and the electron retaining time in the charge accumulation layer 6 becomes approximately $R_K$ $(R_1/R_K)(R_2/R_K)(R_3/R_K)$ Cg. By the way, $R_K$ is quantum resistance (approximately 13 kΩ).

For example, if the tunnel resistance $R_1$, $R_2$ and $R_3$ respectively of the barrier layers 4a, 4b and 4c are 1×10$^{10}$Ω and the capacitance Cg of the barrier layer 4d are 1×10$^{-18}$ F respectively, then the electron retaining time becomes approximately 6×10$^4$ s. In other words, the electrons accumulated in the charge accumulation layer 6 are retained in a non-volatile manner.

Information thus written is read out by measuring the value of a current flowing through the conduction layer 1a and detecting its change.

Figure 7:
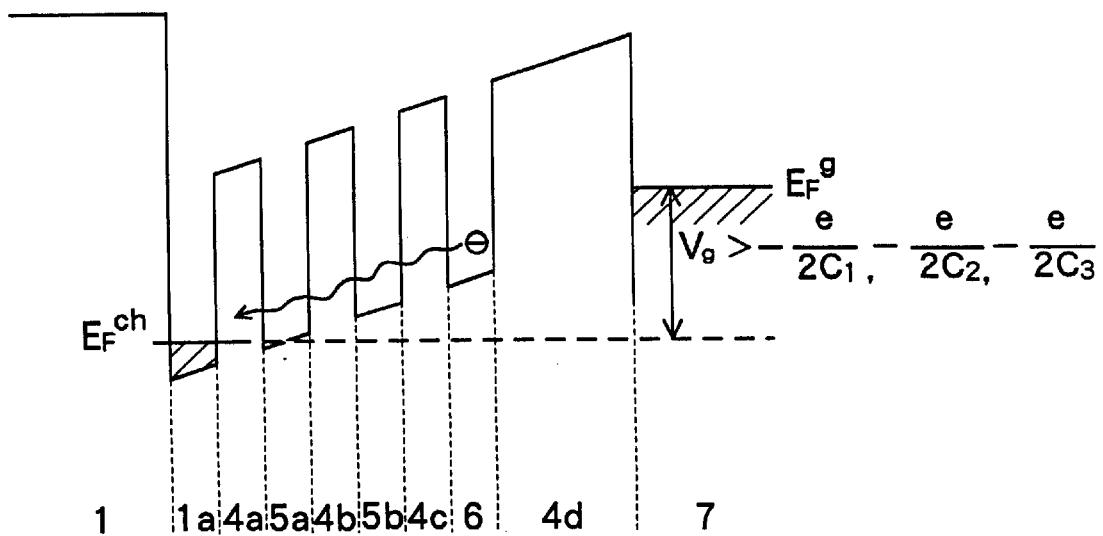
FIG. 7 is an energy band structure diagram for description of erasing operation of the memory device of FIGS. 1 and 2.

Furthermore, the information thus written is erased by applying a negative gate voltage Vg of reverse bias to the gate electrode as shown in FIG. 7. If the gate voltage Vg is made larger than each $-e/2C_1$, $-e/2C_2$ and $-e/2C_3$, then the electrons accumulated in the charge accumulation layer 6 transit to the conduction layer 1a via the transition layers 5a and 5b according to the Coulomb blockade effect in this case as well. This transition is caused by resonance tunneling occurred between the conduction layer 1a and the charge accumulation layer 6 in the same way as the writing operation. Therefore, the transition occurs at extremely high speed. Further, even if the gate voltage Vg is returned to zero thereafter, the possibility that the electrons will transit from the conduction layer 1 to the charge accumulation layer 6 becomes extremely small according to the Coulomb blockade effect.

Such memory devices are integrated by using a circuit architecture such as the NAND system, NOR system, or AND system, and used as a memory array.

Such a memory device can be fabricated as described below. It is now assumed that a single crystal Si substrate is used as the substrate 1 and the barrier layers 4a, 4b, 4c and 4d are respectively made of $SiO_2$. It is further assumed that the transition layers 5a and 5b and the charge accumulation layer 6 are made of polycrystal Si and each of the source electrode 2, the drain electrode 3 and the gate electrode 7 are made of Al respectively. The fabrication method in this case will now be described specifically.

Figure 8A:
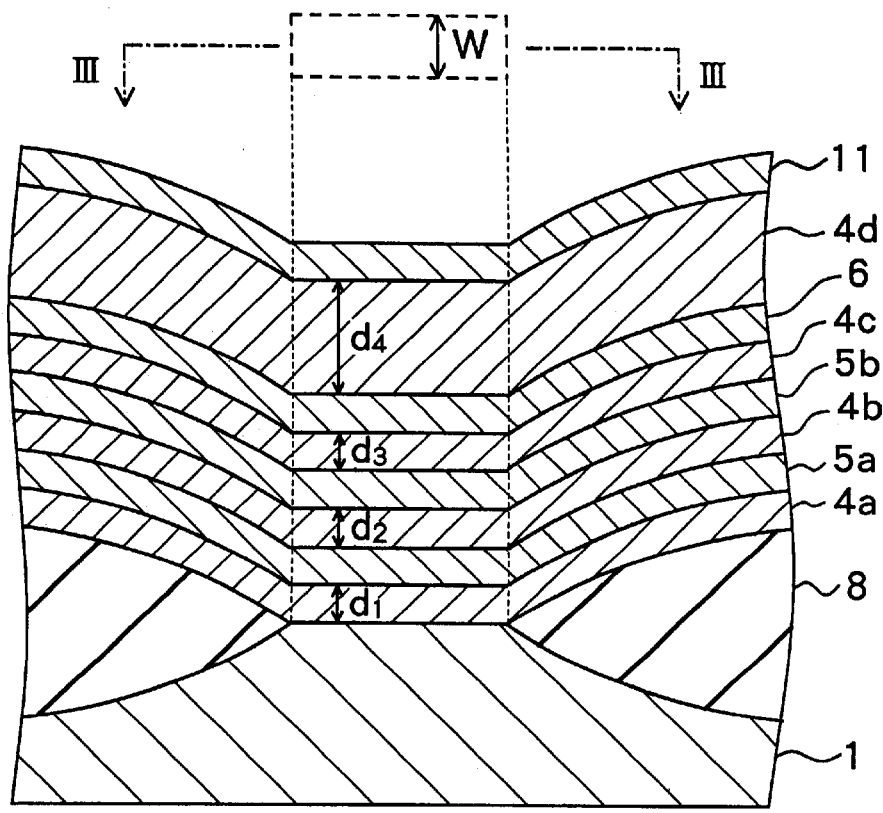
FIGS. 8A and 8B are sectional views showing steps in a fabrication method of the memory device of FIGS. 1 and 2.

FIGS. 8A, 8B, 9A and 9B show respective fabrication steps thereof. In FIG. 8A, a top view and a sectional view taken along a line III—III thereof are shown together.

First, on a suitable substrate 1 made of single crystal Si as shown in FIG. 8A, region forming a device isolation portion (i.e., a region around a rectangle represented by a broken line in FIG. 8A) is selectively oxidized by using, for example, the LOCOS (Local Oxidation of Silicon) method so as to form a device isolation portion 8 made of $SiO_2$. At this time, it is desirable that a width W, in the length direction of the gate electrode 7, of a region surrounded by the device isolation portion 8 is 100 nm or less in order to make the area of contact between the conduction layer 1a and the barrier layer 4a small.

Subsequently, on the substrate 1 having the device isolation portion 8 formed thereon, a barrier layer 4a having a thickness of d1 made of $SiO_2$, a transition layer 5a having a suitable thickness made of polycrystal Si, a barrier layer 4b having a thickness of d2 made of $SiO_2$, a transition layer 5b having a suitable thickness made of polycrystal Si, a barrier layer 4c having a thickness of d3 made of $SiO_2$, a charge accumulation layer 6 having a thickness of d4 made of $SiO_2$ are stacked one after another as shown in FIG. 8A by using, for example, the PECVD (Plasma Enhanced Chemical Vapor Deposition) method, sputtering method, or thermal oxidation method. Here, the thickness d1, d2 and d3 respectively of the barrier layers 4a, 4b and 4c are respectively made to be, for example, 50 nm or less to facilitate tunneling of electrons. The thickness d4 of the barrier layer 4d is made to be, for example, at least 50 nm so that electrons may not tunnel easily.

Subsequently, as shown in FIG. 8A, Al is deposited on the barrier layer 4d by using, for example, the sputtering method. A gate electrode forming layer 11 to form a gate electrode 7 is thus formed.

Figure 8B:
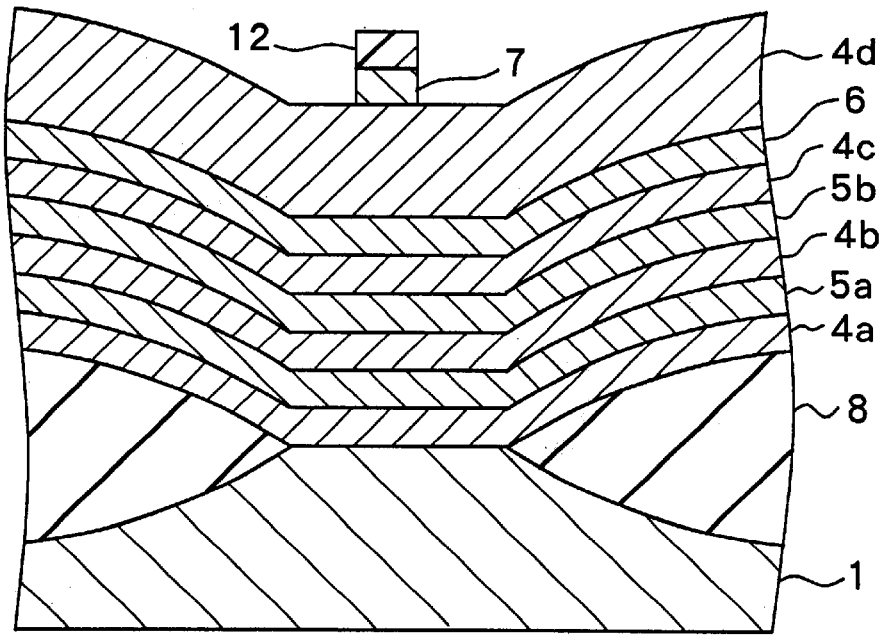

After the gate electrode forming layer 11 is formed, a photoresist film 12 is formed thereon by coating as shown in FIG. 8B. A mask pattern corresponding to the shape of the gate electrode 7 is formed by photolithography. Thereafter, dry etching is conducted by using this photoresist film 12 as a mask and using $SF_6$ (sulfur hexafluoride) or $Cl_2$ (chlorine).

By thus removing the gate electrode forming layer 11 selectively, the gate electrode 7 is formed.

Figure 9A:
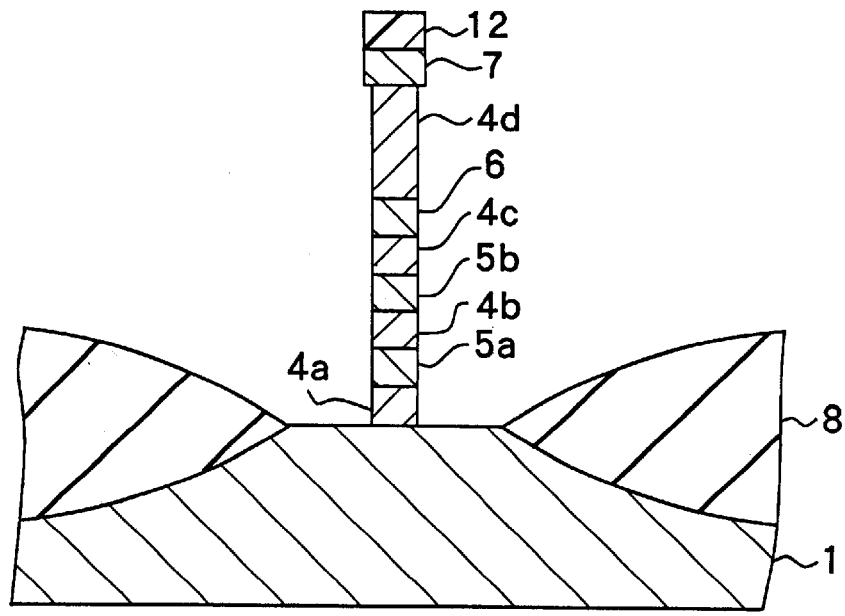
FIGS. 9A and 9B are sectional views showing steps following those of FIGS. 8A and 8B.

After the gate electrode 7 is formed, the barrier layer 4d, the charge accumulation layer 6, the barrier layer 4c, the transition layer 5b, the barrier layer 4b, the transition layer 5a and the barrier layer 4a are selectively removed as shown in FIG. 9A by using the photoresist film 12 as a mask and by RIE (Reactive Ion Etching) using, for example, $CF_4$ (carbon tetrafluoride) or $SF_6$ as etching gas, or ECR-RIBE (Reactive Ion Beam Etching) using ECR (Electron Cyclotron Resonance). In a direction perpendicular to the direction of stacking, therefore, the barrier layers 4a, 4b, 4c and 4d, the transition layers 5a and 5b, and the charge accumulation layer 6 take the same shape as that of the gate electrode 7. Its size becomes smaller than that of the gate electrode 7 as a whole. Thereafter, the photoresist film 12 is removed.

Figure 9B:
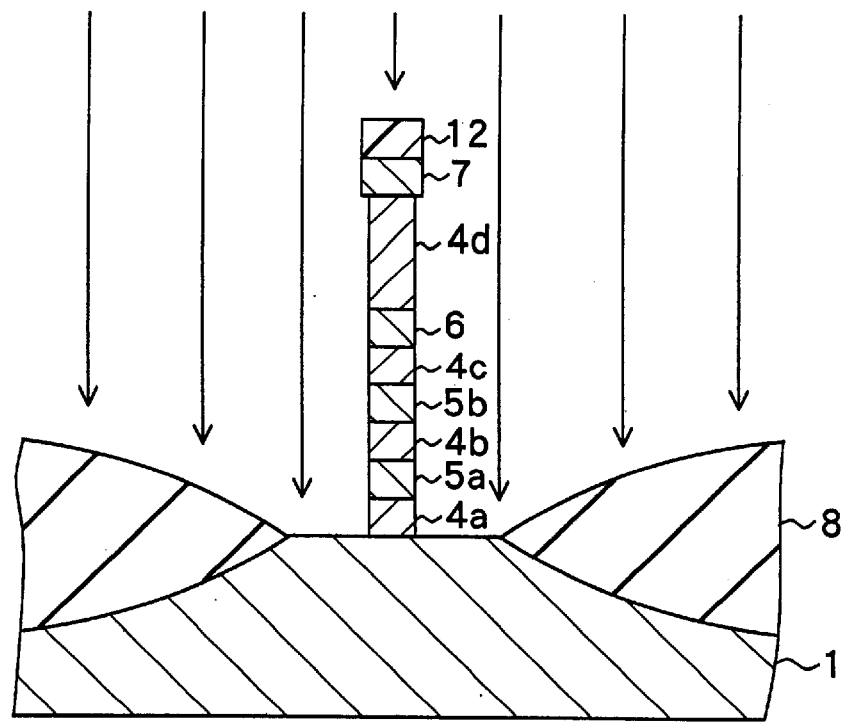

After the photoresist film 12 is removed, impurities such as P (phosphorus) or As (arsenic) are implanted to the surface of the substrate 1 as shown in FIG. 9B by using ion implantation or plasma doping of $PH_3$ (phosphine). This aims at bringing the conduction layer 1a in ohmic contact with the source electrode 2 and the drain electrode 3.

After the impurities are implanted, Al is selectively evaporated by using, for example, the vacuum evaporation method or sputtering method. The source electrode 2 and the drain electrode 3 are thus formed. Thereafter, annealing is conducted at a temperature on the order of 400° C. The source electrode 2 and the drain electrode 3 are thus alloyed with the surface of the substrate 1 (i.e., the conduction layer 1a), and are brought into ohmic contact. Thereby, the memory device shown in FIGS. 1 and 2 are formed.

In the case where a SOI substrate, a SOS substrate, or a substrate having a polycrystal Si thin film formed on a glass substrate or a plastic substrate is used as the substrate 1, the device isolation portion 8 of this memory device may be formed by selectively removing the Si thin film of the surface of the substrate 1 by means of plasma etching using $SF_6$, $Cl_2$ or $CF_4$, or wet etching using HF (hydrogen fluoride), instead of forming the device isolation portion 8 by using the LOCOS method.

This memory device may also be fabricated by the following method. It is now assumed that an insulative GaAs substrate is used as the substrate 1, the barrier layers 4a, 4b, 4c and 4d are made of n-type AlGaAs mixed crystal, and the transition layers 5a and 5b, and the charge accumulation layer 6 are made of GaAs respectively. The method in this case will now be described specifically.

Figure 10A:
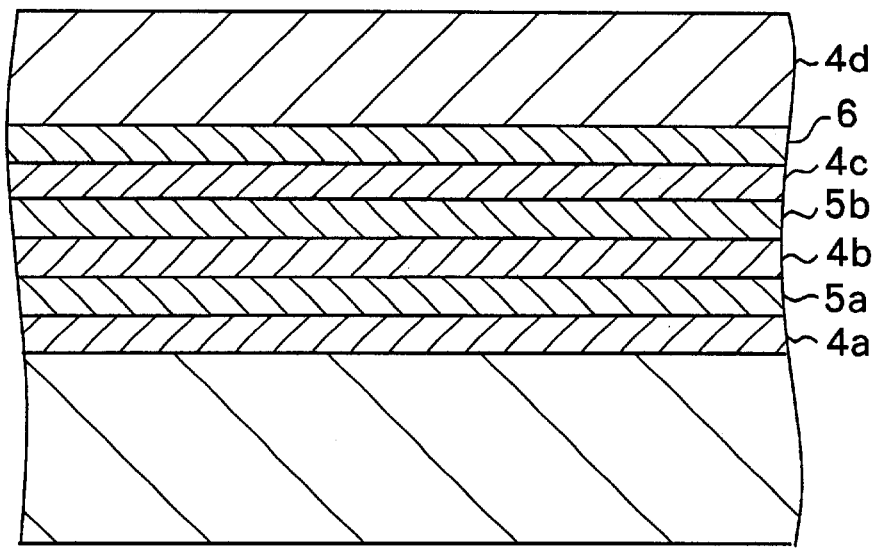
FIGS. 10A and 10B are sectional views showing steps in another fabrication method of the memory device of FIGS. 1 and 2.
Figure 10B:
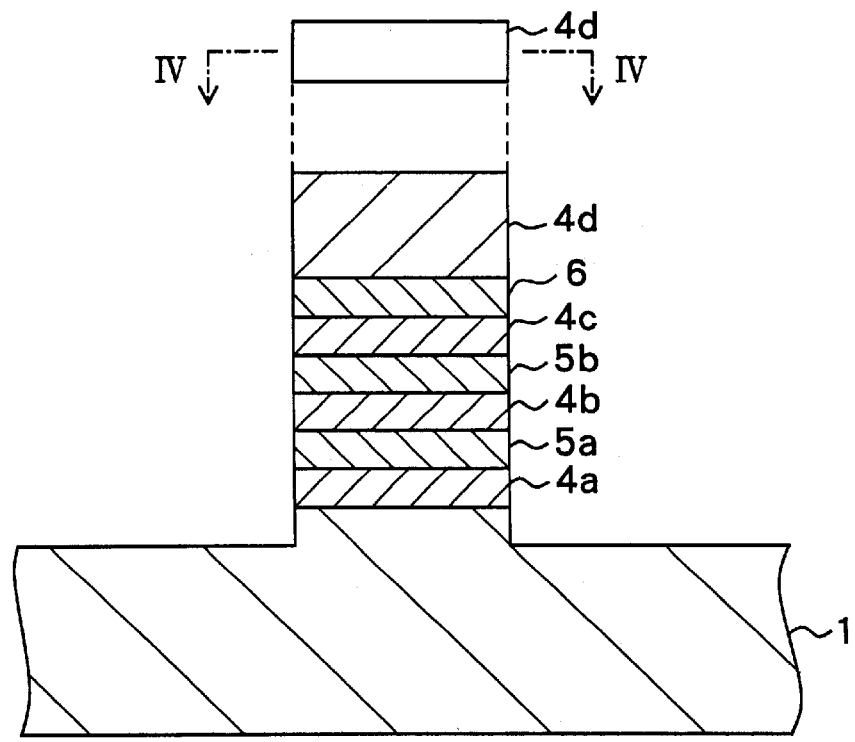
Figure 11A:
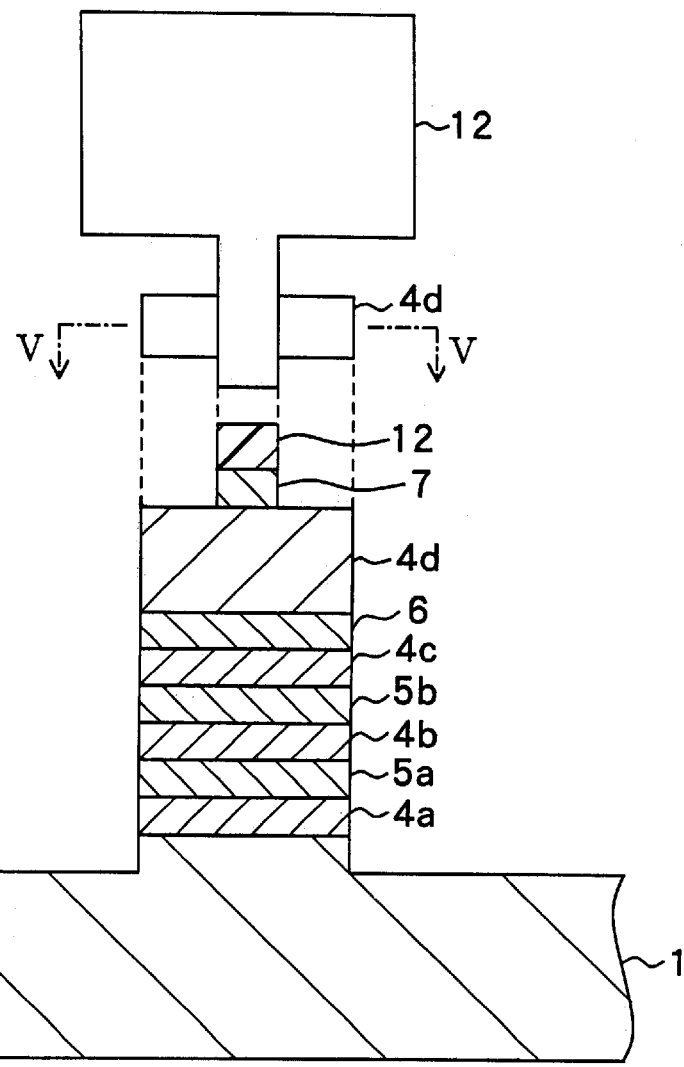
FIGS. 11A and 11B are sectional views showing steps following those of FIGS. 10A and 10B.

FIGS. 10A, 10B, 11A and 11B show its fabrication steps of the memory device. In FIG. 10B, a top view and a sectional view taken along a line IV—IV thereof are shown together. In FIG. 11A, a top view and a sectional view taken along a line V—V thereof are shown together.

As shown in FIG. 10A, first on a suitable substrate 1 made of insulative GaAs, a barrier layer 4a having a thickness of d1 made of n-type AlGaAs, a transition layer 5a having a suitable thickness made of GaAs, a barrier layer 4b having a thickness of d2 made of n-type AlGaAs, a transition layer 5b having a suitable thickness made of GaAs, a barrier layer 4c having a thickness of d3 made of n-type AlGaAs, a charge accumulation layer 6 having a suitable thickness made of GaAs, and a barrier layer 4d having a thickness d4 made of n-type AlGaAs are stacked one after another by using, for example, the MBE (Molecular Beam Epitaxy) method, the MOCVD (Metal Organic Chemical Vapor Deposition) method or the MOMBE (Metal Organic Molecular Beam Epitaxy) method. Here, the thickness d1, d2, d3 and d4 respectively of the barrier layers 4a, 4b, 4c and 4d have the same value as that of the foregoing fabrication method.

Subsequently, as shown in FIG. 10B, the barrier layer 4d, the charge accumulation layer 6, the barrier layer 4c, the transition layer 5b, the barrier layer 4b, the transition layer 5a, and the barrier layer 4a are selectively removed and device isolation is conducted, for example, by reactive ion etching using $SiCl_4$ (silicon tetrachloride) or $Cl_2$, or reactive ion beam etching. In this fabrication method, the device isolation portion 8 as shown in FIG. 2 is not formed.

Subsequently, as shown in FIG. 11A, Al is deposited on the barrier layer 4d and the substrate 1, for example, by using the sputtering method. A gate electrode forming layer to form a gate electrode 7 is thus formed. Thereafter, a photoresist film 12 is formed thereon in the same way as the foregoing fabrication method. By removing the gate electrode forming layer selectively, the gate electrode 7 is formed.

Figure 11B:
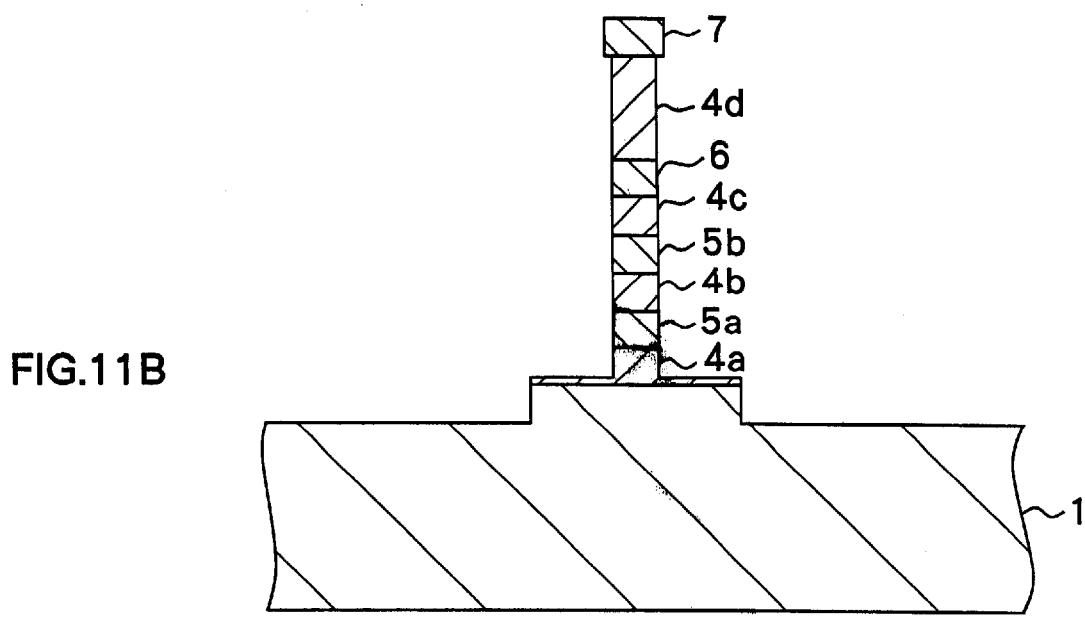

After the gate electrode 7 is formed, the barrier layer 4d, the charge accumulation layer 6, the barrier layer 4c, the transition layer 5b, the barrier layer 4b, the transition layer 5a and partway of the barrier layer 4a are selectively removed as shown in FIG. 11B by using the photoresist film 12 as a mask and by reactive ion etching using, for example, $SiCl_4$ or Cl, or reactive ion beam etching. In this case, the widths the barrier layers 4a, 4b, 4c and 4d, the transition layers 5a and 5b, and the charge accumulation layer 6 in a direction perpendicular to the direction of stacking become narrower than that of the gate electrode 7. Thereafter, the photoresist film 12 is removed.

After the photoresist film 12 is removed, impurities such as Si are implanted into such a region in which the barrier layer 4a is exposed by using ion implantation. After the ion implantation, for example, AuGe, Ni (nickel), and Au (gold) are selectively evaporated one after another by using the vacuum evaporation method or the sputtering method. The source electrode 2 and the drain electrode 3 are thus formed. Thereafter, annealing is conducted at a temperature on the order of 400° C. The source electrode 2 and the drain electrode 3 are thus brought into ohmic contact with the conduction layer 1a. Thereby, the memory device shown in FIGS. 1 and 2 are formed.

In the case where the barrier layers 4a, 4b, 4c and 4d, the transition layers 5a and 5b, and the charge accumulation layer 6 are made of materials having mutually different lattice constants, it is alternatively possible for this memory device to make the transition layers 5a and 5b, and the charge accumulation layer 6 become quantum box layers and make the capacitance of the barrier layers 4a, 4b, 4c and 4d become less than a predetermined value by using unevenness caused at the time of stacking even if etching is not conducted. For example, in the case where the barrier layers 4a, 4b, 4c and 4d are made of GaAs and the transition layers 5a and 5b and the charge accumulation layer 6 are made of InGaAs respectively, periodic unevenness is formed on the surface of each of the transition layers 5a and 5b and the charge accumulation layer 6 when the transition layers 5a and 5b and the charge accumulation layer 6 each made of InGaAs are made to grow. Therefore, the barrier layers 4a, 4b and 4c each made of GaAs should be made to grow so as to fill up the unevenness.

In the memory device according to the present embodiment, each capacitance $C_1$, $C_2$ and $C_3$ respectively of the barrier layers 4a, 4b and 4c is thus made to become smaller than $e^2/k_BT$. Therefore, it becomes possible to prevent charge transition between the conduction layer 1a and the charge accumulation layer 6 even if a voltage in a predetermined range ($\pm e/2C_1$, $\pm e/2C_2$ or $\pm e/2C_3$) is applied to the gate electrode 7. In other words, even if the voltage varies somewhat, it is possible to prevent charge transition caused thereby and information can be retained accurately. Also when the memory device is used in a memory array, information can be written, erased and retained accurately.

Furthermore, with this memory device having the transition layers 5a and 5b, the charge transition between the conduction layer 1a and the charge accumulation layer 6 can be conducted by using the resonance tunneling. Therefore, writing and erasing information can be conducted at extremely high speed and with a low gate voltage Vg. Accordingly, the device can be made finer, and the power dissipation for writing and erasing can be reduced. As a result, a highly integrated memory array can be implemented.

Furthermore, since the transition layers 5a and 5b are provided in this memory device, the information retaining time can be prolonged by suitably adjusting the number of transition layers. Therefore, it becomes possible to use the memory device as a non-volatile memory.

(Second Embodiment)

A second embodiment shows a particular example differing from the first embodiment in the materials of the barrier layers 4a, 4b, 4c and 4d, the transition layers 5a and 5b, and the charge accumulation layer 6. Therefore, the same components are denoted by like reference numerals, and detailed description thereof will be omitted here.

Here, the barrier layers 4a, 4b, 4c and 4d are made of a suitable insulator, and the transition layers 5a and 5b, and the charge accumulation layer 6 are made of suitable metal respectively. For example, the conduction layer 1a is made of Si, the barrier layers 4a, 4b, 4c and 4d are made of $Al_2O_3$ (aluminum oxide), and the transition layers 5a and 5b, and the charge accumulation layer 6 are made of Al respectively. Furthermore, the barrier layers 4a, 4b, 4c and 4d may be made of an insulator such as TiOx or NbOx, and the transition layers 5a and 5b may be made of metal such as Ti or Nb respectively.

The memory device having such a configuration operates in the same way as the memory device according to the first embodiment. The present memory device can be fabricated in the same way as the memory device of the first embodiment. The present memory device provides the same effects as those of the memory device of the first embodiment.

Heretofore, the present invention has been described by referring to the embodiments. However, the present invention is not limited to the above described embodiments, but various changes are possible. For example, in the above described embodiments, the case where electrons convey information has been described. In the present invention, however, holes may convey the information. Operation in that case is nearly the same except that electrons in the above described embodiments are replaced by holes.

In the above described embodiments, the case where the transition layers 5a and 5b are two layers has been described specifically. However, the number of transition layers need only to be at least one. Furthermore, three or more transition layers may also be provided. For example, if the number of barrier layers each in contact with a transition layer (the number of barrier layers through which the charge can tunnel) is n, each of capacitances respectively of the barrier layers is Ci (where i=1, 2, . . . , n, the same will apply hereinafter), and each of resistances respectively of the barrier layers is Ri, then the gate voltage Vg required to write or erase information is $\pm e/2Ci$. At a voltage in this range, charge transition does not occur between the charge accumulation layer 1a and the charge accumulation layer 6. Furthermore, time required for writing and erasing is ($R_1$+

$R_2 + \ldots + R_i$) Cg, and the information retaining time is $R_K$ ($R_1/R_K$) ($R_2/R_K$) ... ($R_i/R_K$) Cg. In the same way as the above described embodiments, Cg is a capacitance of the barrier layer located between the gate electrode 7 and the charge accumulation layer 6.

If, in the case where four transition layers and five barrier layers allowing the charge to tunnel are formed, the tunnel resistance $R_i$ of each barrier layer is $1 \times 10^9 \Omega$ and the capacitance Cg of the barrier layer between the gate electrode 7 and the charge accumulation layer 6 is $1 \times 10^{-18}$ F, then the time required for writing and erasing becomes ($R_1+R_2+R_3+R_4+R_5$) Cg=$5R_iCg$=$5 \times 10^9 \times 10^{-18}$=5 ns. The information retaining time becomes $R_K$ ($R_i/R_K$) ($R_2/R_K$) ($R_3/R_K$) ($R_4/R_K$) ($R_5/R_K$)Cg=$R_K(R_i/R_K)^5$ Cg=$13 \times 10^3 \times (10^9/(13 \times 10^3))5 \times 10^{-18} \approx 3.5 \times 10^{10}$ s.

If the number of the transition layers is increased, the charge retaining time in the charge accumulation layer 6 can be prolonged, which makes it desirable as a non-volatile memory. If in this example four transition layers are formed as well, then the information retaining time can be made approximately equal to $3.5 \times 10^{10}$ s, and the memory device can be used practically as a non-volatile memory. However, this is a value obtained when the temperature is absolute zero degree. At a temperature in use, therefore, the information retaining time becomes shorter than this value.

Furthermore, the embodiments have been described by referring to particular examples for the case where the conduction layer 1a, the transition layers 5a and 5b, and the charge accumulation layer 6 are made of the same first material, and the barrier layers 4a, 4b, 4c and 4d are made of the same second material. However, they may be made of different materials, respectively.

In addition, in each of the above described embodiments, a particular fabrication method of the memory device has been described by referring to an example. However, the memory device can also be fabricated by using adifferent methods.

In the memory device of the present invention as heretofore described, each of the capacitances respectively of barrier portions located between a transition layer and the conduction layer, between transition layers, and between a transition layer and the charge accumulation layer is made smaller than $e^2/k_BT$. Therefore, it becomes possible to prevent charge transition between the conduction layer and the charge accumulation layer even if a voltage in a predetermined range is applied in between. Even if the voltage varies somewhat, therefore, it is possible to prevent charge transition caused thereby, and information can be retained accurately. Such effects can be obtained.

Furthermore, in the memory device of the present invention, at least one transition layer is provided. Therefore, the charge transition between the conduction layer and the charge accumulation layer can be conducted via a transition layer. Writing and erasing information can be conducted at extremely high speed and with a low voltage. Accordingly, the device can be made finer, and the power dissipation for writing and erasing can be reduced. Such effects can be also obtained.

Furthermore, in another memory device of the present invention, the capacitance respectively of a barrier layer located between the conduction layer and a quantum box layer and barrier layers located in between each quantum box layer are made smaller than $e^2/k_BT$. Therefore, it becomes possible to prevent charge transition between the conduction layer and the coupled quantum box layer even if a voltage in a predetermined range is applied in between. Accordingly, the same effects as the above described effects of the memory device of the present invention are obtained.

In addition, in another memory device of the present invention, the coupled quantum box layer is provided. Therefore, the charge transition between the conduction layer and the coupled quantum box layer can be conducted by resonance tunneling. Writing and erasing information can be conducted at extremely high speed and with a low voltage. Accordingly, the same effects as the memory device of the present invention described above are obtained.

Furthermore, in the memory array of the present invention, memory devices of the present invention are used. Even if the memory array is implemented in an integrated form, writing, erasing and retaining information can be conducted accurately. In addition, an effect of high-degree integration is also obtained.

What is claimed is:

1. A memory device comprising:

a conduction layer serving as a current passage;

a charge accumulation layer for accumulating charges transited from the conduction layer;

one or more transition layers for transiting charges from the conduction layer to the charge accumulation layer being formed between the charge accumulation layer and the conduction layer; and a plurality of barrier portions each having a capacitance smaller than $e^2/k_BT$, where e is the electric prime quantity, $k_B$ is the Boltzmann's constant, and T is operation temperature being respectively formed between one of the transition layers and the conduction layer, in between the transition layers, and between one of the transition layers and the charge accumulation layer.

2. A memory device according to claim 1, wherein the conduction layer, the transition layers, and the charge accumulation layer are respectively made of a semiconductor;

the barrier portion located between the conduction layer and the transition layer has a barrier layer made of a semiconductor which is smaller in electron affinity or larger in work function than the semiconductor of the conduction layer and the semiconductor of the transition layer;

the barrier portion located between the transition layers has a barrier layer made of a semiconductor which is smaller in electron affinity or larger in work function than the semiconductors of the transition layers; and the barrier portion located between the transition layer and the charge accumulation layer has a barrier layer made of a semiconductor which is smaller in electron affinity or larger in work function than the semiconductor of the transition layer and the semiconductor of the charge accumulation layer.

3. A memory device according to claim 2, wherein the conduction layer, the transition layers, and the charge accumulation layer are respectively made of Si; and each of the barrier layers serving as barrier portions is made of $SiO_2$, $Si_3N_4$, or SiON.

4. A memory device according to claim 2, wherein the conduction layer, the transition layers, and the charge accumulation layer are made either SiGe or Ge; and each of the barrier layers serving as barrier portions is made of SiGe, Si, $SiO_2$, $Si_3N_4$, or SiON.

5. A memory device according to claim 2, wherein the conduction layer, the transition layers, and the charge accumulation layer are respectively made of a Group III–V compound semiconductor including at least one element selected from the group consisting of In and Ga of the Group III element and As of the Group V element; and each of the barrier layers serving as barrier portions is made of a Group III–V compound semiconductor including at least one element selected from the group consisting of In, Al and Ga of the Group III element and As of the Group V element.

6. A memory device according to claim 2, wherein the conduction layer, the transition layers, and the charge accumulation layer are respectively made of a Group III–V compound semiconductor including at least one element selected from the group consisting of In and Ga of the Group III element and Sb of the Group V element; and each of the barrier layers serving as barrier portions is made of a Group III–V compound semiconductor including at least one element selected from the group consisting of In, Al and Ga of the Group III element and Sb of the Group V element.

7. A memory device according to claim 1, wherein the conduction layer is made of a semiconductor;

the transition layers and the charge accumulation layer are respectively made of metal; and each of the barrier portions is formed of a barrier layer made of an insulator.

8. A memory device according to claim 7, wherein the transition layers and the charge accumulation layer are respectively made of Al; and each of the barrier layers serving as barrier portions is made of $Al_2O_3$.

9. A memory device comprising:

a conduction layer serving as a current passage; and a coupled quantum box layer formed so as to be adjacent to the conduction layer, each capacitance of a barrier layer located between the conduction layer and a quantum box layer and barrier layers located in between each quantum box layer being smaller than $e^2/k_BT$ (where e is the electric prime quantity, $k_B$ is the Boltzmann's constant, and T is operation temperature).

10. A memory array formed by integrating a plurality of memory devices, the memory devices comprising:

a conduction layer serving as a current passage;

a charge accumulation layer for accumulating charges transited from the conduction layer;

one or more transition layers for transiting charges from the conduction layer to the charge accumulation layer being formed between the charge accumulation layer and the conduction layer; and a plurality of barrier portions each having a capacitance smaller than $e^2/k_BT$, where e is the electric prime quantity, $k_B$ is the Boltzmann's constant, and T is operation temperature, being respectively formed between one of the transition layers and the conduction layer, between the transition layers, and one of the transition layers and the charge accumulation layer.

11. A memory array formed by integrating a plurality of memory devices, each of the memory devices comprising:

a conduction layer for serving as a current passage; and a coupled quantum box layer formed so as to be adjacent to the conduction layer, each capacitance of a barrier layer located between the conduction layer and a quantum box layer and barrier layers located in between each quantum box layer being smaller than $e^2/k_BT$, where e is the electric prime quantity, $k_B$ is the Boltzmann's constant, and T is operation temperature.

12. A memory device according to claim 1, wherein the conduction layer defines no more than one width, wherein the no more than one width is constant so as to be adapted to pass all charges without tunneling.

13. A memory device according to claim 9, wherein the conduction layer defines no more than one width, wherein the no more than one width is constant so as to be adapted to pass all charges without tunneling.

14. A memory device according to claim 10, wherein the conduction layer defines no more than one width, wherein the no more than one width is constant so as to be adapted to pass all charges without tunneling.

15. A memory device according to claim 11, wherein the conduction layer defines no more than one width, wherein the no more than one width is constant so as to be adapted to pass all charges without tunneling.

* * * * *